Figure 1:
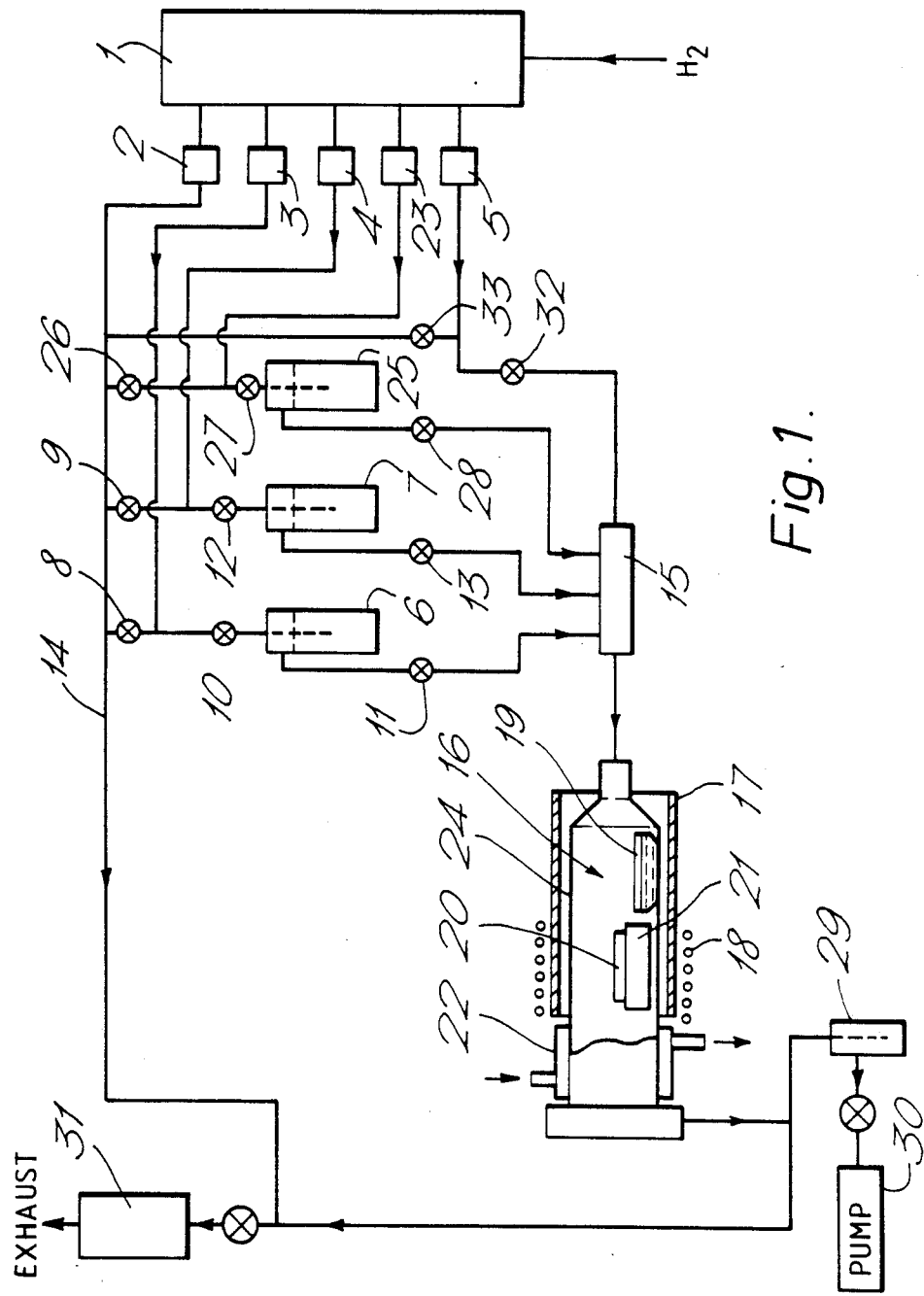

United States Patent [19]

Irvine et al.

[11] Patent Number: 4,566,918
[45] Date of Patent: Jan. 28, 1986

[54] UTILIZING INTERDIFFUSION OF SEQUENTIALLY DEPOSITED LINKS OF HGTE AND CDTE

[75] Inventors: Stuart J. C. Irvine, Cradley; John B. Mullin, West Malvern; Jean Giess, Colwall, all of England

[73] Assignee: The Secretary of State for Defence in Her Britannic Majesty's Government of the United Kingdom of Great Britain and Northern Ireland, Great Britain

[21] Appl. No.: 641,483

[22] Filed: Aug. 16, 1984

[30] Foreign Application Priority Data

Sep. 13, 1983 [GB] United Kingdom ............... 8324531

[51] Int. Cl.$^4$ .................... H01L 21/36; H01L 21/477
[52] U.S. Cl. ............................ 148/175; 29/576 E; 148/174; 148/DIG. 63; 148/DIG. 64; 148/DIG. 160; 156/613; 156/614; 156/DIG. 72; 156/DIG. 82; 427/87; 357/16; 357/61
[58] Field of Search ............... 148/174, 175, DIG. 63, 148/DIG. 64, DIG. 160; 29/576 E; 156/613, 614, DIG. 72, DIG. 82; 427/87; 357/61, 16

[56] References Cited

U.S. PATENT DOCUMENTS

| 3,218,203 | 11/1965 | Ruehrwein | 148/175 |
|---|---|---|---|
| 3,312,571 | 4/1967 | Ruehrwein | 148/175 |
| 3,619,283 | 11/1971 | Carpenter et al. | 148/174 X |
| 3,622,405 | 11/1971 | Schmit | 156/DIG. 72 |
| 3,664,866 | 5/1972 | Manasevit | 156/613 |
| 3,725,135 | 4/1973 | Hager et al. | 148/175 X |
| 4,435,224 | 3/1984 | Durand | 148/175 X |
| 4,439,267 | 3/1984 | Jackson | 156/614 |

FOREIGN PATENT DOCUMENTS

2078695 1/1982 United Kingdom ....... 156/DIG. 72

OTHER PUBLICATIONS

Kuech et al., "Low Temperature CVD Growth—HgTe on CdTe" J. Electrochem. Soc., vol. 128, No. 5, May 1981, pp. 1142–1144.
Manasevit et al., "Use of Metal-Organics in Preparation of Semiconductor Materials" J. Electrochem. Soc., vol. 118, No. 4, Apr. 1971, pp. 644–647.
Vohl et al., "Vapor Phase Growth of $Hg_{1-x}Cd_xTe$ Epitaxial Layers" J. Electronic Materials, vol. 7, No. 5, 1978, pp. 659–678.
Tufte et al., "Growth and Properties of $Hg_{1-x}Cd_xTe$ Epitaxial Layers" J. Applied Physics, vol. 40, No. 11, Oct. 1969, pp. 4559–4568.

Primary Examiner—William G. Saba
Attorney, Agent, or Firm—Cushman, Darby & Cushman

[57] ABSTRACT

A layer of $Cd_xHg_{1-x}Te$ is grown on a substrate by growing layers of HgTe $t_1$ thick, and CdTe $t_2$ thick alternately. The thicknesses $t_1$ and $t_2$ combined are less than 0.5 μm so that interdiffusion occurs during growth to give a single layer of $Cd_xHg_{1-x}Te$. The HgTe layers are grown by flowing a Te alkyl into a vessel containing the substrate and filled with an Hg atmosphere by an Hg bath. The CdTe layers are grown by flowing of Cd alkyl into the vessel where it combines preferentially with the Te on the substrate. Varying the ratio of $t_1$ to $t_2$ varies the value of x. Dopants such as alkyls or hydrides of Al, Ga, As and P, or Si, Ge, As and P respectively may be introduced to dope the growing layer.

13 Claims, 3 Drawing Figures

UTILIZING INTERDIFFUSION OF SEQUENTIALLY DEPOSITED LINKS OF HGTE AND CDTE

The invention relates to the manufacture of the material cadmium mercury telluride i.e. $Cd_xHg_{1-x}Te$ commonly referred to as C.M.T. or M.C.T.

Such a material in its semiconducting form is used as a detector of infra red radiation in thermal imaging systems. These detectors comprise small pieces of C.M.T. cut and polished flat to which are attached electrical contacts. U.K. Patent Specification No. 859,588, published Jan. 25, 1961, describes the production and use of C.M.T. detectors.

At present C.M.T. appears to be the most useful of all infra red detectors and is therefore used in the majority of high performance thermal imager systems.

C.M.T. is a difficult material to grow and handle, partly because of the volatile nature of the components.

Present methods of manufacture can be broadly classified into bulk melt growth and epitaxial methods.

The most important melt growth methods are: The Bridgman method involving growth in a sealed container carried out in a vertical or horizontal manner; the cast quench anneal method; a cast recrystalline anneal method; and a so-called slush method. All these methods involve batch preparation that is lengthy and expensive taking weeks rather than days to complete. A further disadvantage is that the crystals produced are roughly cylindrical and need slicing, grinding, lapping, etching and dicing into small pieces for use as e.g. detectors.

Epitaxial methods of manufacturing semiconductors on the other hand are intrinsically quicker in so far as they produce thin layers of semiconductor material directly onto a substrate often in a matter of hours or minutes. In the case of materials like GaAs, InP, and GaP well developed methods are available for the growth of homo-epitaxial layers of these compounds onto substrates of the parent semiconductor by either liquid or vapour phase processes. However no such well developed art is available in the case of C.M.T.

In the case of the epitaxial growth of C.M.T. from the liquid it has been reported by Harman, J. Electronic Materials 8 (1979) 191; and by Schmit and Bowers, Appl. Phys. Letters 35 (1979) 457; and by Wang et al, J. Electrochem. Soc. 127 (1980) 175; and by Bowers et al, I.E.E.E. Trans. Electron Devices ED 27 (1980) 24; and by Wang et al, I.E.E.E. Trans. Electron Devices ED 27 (1980) 154; that it is possible to grow layers of C.M.T. from supersaturated solutions in excess tellurium or mercury onto substrates of cadmium telluride (CdTe). Such processes demand considerable skill and a very long development period. The epitaxial layers frequently suffer from surface blemishes which can render them useless for device fabrications. Such methods also suffer a fundamental limitation in respect of composition control i.e. the value of x (in $Cd_xHg_{1-x}Te$) cannot be independently controlled. Thus to produce epitaxial layers having different values of x it is necessary to use differently composed solutions of C.M.T. in Te.

A vapour phase epitaxial (V.P.E.) process for growing C.M.T. has been reported by Vohl & Wolfe (J. Electronic Materials, 7 (1978) 659). This uses an open flow process with independently controlled sources of the elements Cd, Hg, and Te. However this method suffers a fundamental limitation in the inability to effect adequate control of the values of x at the low deposition temperature that is needed to produce C.M.T. particularly in the important range x=0.2–0.3. Because of the low vapour pressure of Cd and Te in the region of 400° C. the input vapours can suffer a capricious reduction in composition before they reach the substrate. When the substrate is held at a temperature suitable for epitaxial C.M.T. growth the temperature gradient in the deposition chamber is not high enough to prevent condensation of CdTe upstream from the substrate.

Epitaxial layers of C.M.T. have also been produced by subliming sources of HgTe onto a CdTe substrate in close promity—so-called close-spaced epitaxy—with or without the presence of additional Hg. Examples include the work of Cohen-Solal and co-workers, and Tufte and Stelzer. References to these works can be found in J. Appl.Phys. 40 (1969) 4559.

This technique relies on the production of C.M.T. by the interdiffusion of Cd and Hg between the substrate and the epitaxial layer. It suffers from the problem of compositional non-uniformity in the direction normal to the plane of the layer. It does not have the advantages of independent control of composition enjoyed by an open flow technique.

Another epitaxial growth technique is described in J. Electrochem Soc. Vol. 128 (1981) p.1171.

In this technique a layer of CdTe is deposited onto a mica substrate followed by a layer of HgTe. This is later followed by annealing to cause interdiffusion and results in a single layer of $Cd_xHg_{1-x}Te$ on mica. Only a single layer of one value of x can be grown in this manner. Also for some applications the presence of a mica substrate reduces or prevents good device performance.

Epitaxial layers of GaAs have been grown successfully by V.P.E. using gallium alkyl and arsine. This contrasts with the situation concerning C.M.T. where it is common knowledge that the attempted growth of C.M.T. using the three alkyls of the elements Cd, Hg and Te in combination has not been successful.

One method for overcoming the above problems is described in G.B. Patent Application No. 2,078,695 A. This describes growing CMT onto a substrate using alkyls of Cd and Te. The substrate is arranged in an atmosphere of Hg inside a chamber and Cd, and Te alkyls are simultaneously admitted into the chamber. By controlling the substrate temperature independently from the chamber temperature and the various pressures and flow rates the material $Cd_xHg_{1-x}Te$ is grown.

A limitation with the above method is the precision with which one can control the lateral uniformity of x. This becomes increasingly important when growing large areas of CMT for use in so-called staring arrays of detectors.

According to this invention the above problem is avoided by sequentially growing very thin separate layers of CdTe and HgTe which interdiffuse whilst growing to give the desired $Cd_xHg_{1-x}Te$ layer. Each layer may be grown at its optimum growth conditions.

According to this invention a method of growing a layer of the ternary alloy $Cd_xHg_{1-x}Te$ onto a substrate comprises the steps of providing an atmosphere of mercury vapour at a required temperature and pressure inside a vessel; controlling the temperature of the substrate independently of the vessel temperature; providing separate supplies of a cadmium compound, a tellurium compound, and a dilutant gas into the vessel to grow a layer of HgTe $t_1$ thick and a layer of CdTe $t_2$ thick in either order; switching the supply of cadmium compound to the substrate on and off to grow a layer of CdTe and of HgTe, the combined thickness $t_1 + t_2$ of the two layers being not greater than 0.5 μm thick, the arrangement being such that the Cd compound decomposes preferentially with the Te compound in the region of the substrate to form CdTe as a layer on the substratre, the Te compound combines with the Hg vapour to form a HgTe layer on the substrate, the thickness of both layers allowing diffusion during growth to give a layer of $Cd_xHg_{1-x}Te$ where $0<x<1$ preferably $0.1 \leq x \leq 0.9$.

The flow rate of Cd and Te compounds may be greater during growth of CdTe than the flow rate of compounds during growth of HgTe. The supply of cadmium compound to the vessel may be arranged in the vessel to direct the cadmium compound over or away from the substrate. In another form the substrate may be moved between gas flows containing Cd with Te and Hg, and Te with Hg, both flows including the dilutant gas.

The grown C.M.T. layer may be a single epitaxial layer or multiple layers. Such a C.M.T. layer or layers may be selectively graded in composition. The C.M.T. layer or layers may also be suitable doped. For example two C.M.T. layers may be grown with two different values of x so that a detector, sensitive to both the 3 to 5 and 8 to 14 μm wavebands may be made. Also a passivating layer of CdTe may be grown on the $Cd_xHg_{1-x}Te$ layer. Suitable II-VI compounds or mixed alloys may be grown on the layer e.g. CdTe, ZnS, $CdTe_xSe_{1-x}$ which may be used to make heterojunctions or form anti-reflection coatings, etc.

The grown layer may be annealed for a period preferably less than 10 minutes to allow further diffusion of the last grown layer. This annealing occurs under a flow of Hg and dilutant gas vapour of typically 0.05 atmospheric partial pressure of Hg and 500 cc/min flow of $H_2$.

The value of x is determined by the thickness of the CdTe and HgTe layers according to the formula $$x = t_2/(t_1 + t_2)$$

The substrate may be CdTe, a II-VI compound or mixed II-VI alloy, silicon (Si), gallium arsenide (GaAs), spinel ($MgAl_2O_4$), alumina or sapphire ($Al_2O_3$), etc.

The volatile cadmium compound may be an alkyl such as dimethyl cadmium, diethyl cadmium, or dipropyl cadmium, etc.

The volatile tellurium compound may be an alkyl such as diethyl telluride, dimethyl telluride, dipropyl telluride, or dibutyl telluride, etc., or equivalent hydrogen substituted tellurium alkyls, such as, e.g. hydrogen ethyl telluride $H(C_2H_5)Te$.

Apparatus for growing a layer of cadmium mercury telluride according to the method of this invention, comprises a vessel containing a substrate, heating means for heating the vessel, a substrate heater, a means for supplying a mercury vapour inside the vessel, means for supplying a cadmium alkyl into the vessel, and means for supplying a tellurium alkyl or hydrogen substituted tellurium alkyl into the vessel.

The mercury vapour may be provided by a bath of mercury inside the vessel adjacent to the substrate.

The vessel heater may be an electrical resistance heater surrounding the vessel to heat both the vessel and mercury bath.

The substrate may be mounted on a carbon susceptor and heated by an R.F. coil surrounding part of the vessel. Alternatively resistance heaters may be used inside the vessel, or an infra red heater may be caused to illuminate the substrate and/or substrate holder.

The compounds of Cd and Te may be supplied by passing high purity hydrogen through two bubblers containing the appropriate compounds of Cd and Te.

The invention will now be described by way of example only with reference to the accompanying drawings of which:

FIG. 1 is a schematic flow diagram; and

Figure 2B:
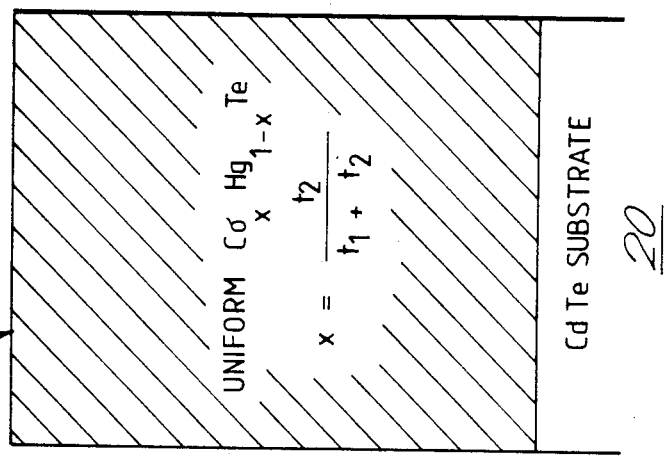
Figure 2A:
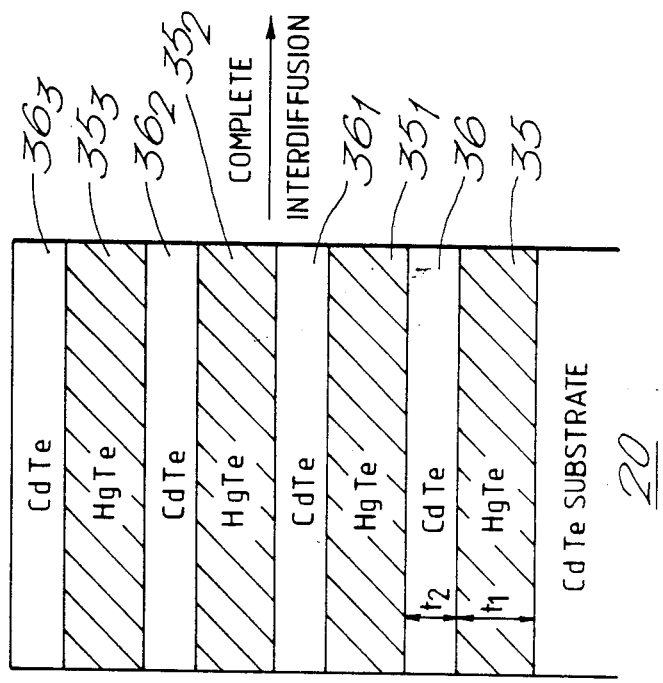

FIGS. 2a, b are sectional views of a substrate during growth and after growth of $Cd_xHg_{1-x}Te$ material.

As shown high purity hydrogen is supplied to a hydrogen manifold 1 which maintains a supply for five mass-flow controllers 2, 3, 4, 5, and 23. Mass flow controller 2 supplies hydrogen via a bypass line 14 to a combustion chamber 31 which burns exhaust vapour in a hydrogen flame. Mass flow controllers 3 and 4 supply hydrogen to alkyl bubblers 6, and 7, which respectively contain an alkyl of cadmium such as dimethyl cadmium and an alkyl of tellurium such as diethyl telluride. Hydrogen flow from the controllers 3 and 4 can be diverted via valves 8 and 9 to the bypass line 14 or through valves 10, 11 and 12, 13 thus enabling the alkyl flows to be turned on and off. Hydrogen bubbling through the liquid alkyl will become saturated with alkyl vapours at the ambient temperature of the liquid alkyl, typically 25° C. These alkyl plus hydrogen streams are mixed in a mixer 15 with a further dilution flow of hydrogen supplied by the mass flow controller 5. Valves 32, 33 allow flow from the controller 5 to be directed to the mixer 15 and/or the bypass line 14. By control of flows through controllers 3, 4, and 5, the concentrations of cadmium and tellurium alkyls in the mixed stream can be independently determined over a wide range of values.

The alkyl plus hydrogen mixture is passed into a reactor vessel 16 which is heated with an electrical resistance furnace 17 and R.F. induction coil 18. Inside the reactor vessel is a mercury bath 19 and a carbon susceptor 21 carrying the substrate 20 to be coated with a layer of C.M.T. The furnace maintains the temperature of the reactor vessel wall from the mercury reservoir 19 to the substrate 20 equal to or greater than the mercury reservoir temperature, the mercury reservoir being heated by thermal conduction through the reactor wall 24. The R.F. induction coil 18 couples into the carbon susceptor 21 thereby heating the substrate to a temperature above that of the reactor wall 24 so that the cadmium and tellurium alkyls will crack and deposit cadmium and tellurium onto the surface of the substrate 20. The temperature of the mercury reservoir 19 is determined by the requirement of the equilibrium partial pressure of mercury to be maintained at the growth interface. The hot reactor wall 24 ensures that the mercury partial pressure in the vapour stream is the same at the substrate 20 as over the mercury reservoir 19.

The walls of the vessel 16 are sufficiently hot to prevent condensation of Hg without significant decomposition of the alkyls, whilst the temperature of the substrate 20 is sufficient to decompose the alkyls at the substrate 20 surface. The substrate may be inclined slightly e.g. 4° to give more uniform growth along the substrate.

A water cooling jacket 22 at one end of the vessel 16 condenses out the unreacted mercury and prevents overheating of reactor vessel and plate seals. The exhaust vapour stream is then mixed with the bypass 14 stream of hydrogen and burnt in the combustion chamber 31 for safety reasons.

A vacuum pump 30 is connected to the vessel 16 via a cold trap 29 for initial purging of the vessel 16.

To grow CMT on CdTe a cleaned substrate 20 is placed on the susceptor 21 in the vessel 16. Typical growth conditions are: vessel walls 16 and Hg bath 19 temperatures 200°-320° C. (eg around 220° to 240° C.); pressure inside the vessel around atmospheric; substrate temperature 400°-430° C. (eg around 410° C.); alkyl bubbler 6, 7 temperature around 25° C.

Valves 12, 13 are opened and 9 is closed to admit the Te alkyl together with $H_2$ into the vessel 16. The Te and Hg combine and form a HgTe 35 (FIG. 2) layer on the substrate. Typically a layer 0.16 μm thick is formed in less than one minute.

Valves 10, 11 are then opened and 8 is closed to allow Cd alkyl into the vessel 16 and valves 33 closed 32 opened to add a dilution flow. The partial pressures of Cd and Te are arranged to be about equal. As a result the Cd alkyl combines preferentially with the Te alkyl in the region of the substrate 20 to form a layer 36 of CdTe. Typically a layer 0.04 μm thick is formed in less than one minute.

The combined thickness of the HgTe and CdTe layer is <0.5 μm thick, preferably <0.25 μm thick. Also the ratio of $t_2/(t_1+t_2)$ is arranged so that the value of x lies in the required range for example 0.2 or 0.3 for use in infra red detectors.

Flow rate of gas through the vessel 16 varies with the growing layer. Typically the flow rate during CdTe growth is 4 to 12 times that during HgTe growth. Typical flow rates for a 4 cm diameter vessel are 500 cc/min during HgTe growth and 4,000 cc/min during CdTe growth.

The valves 10, 11 and 8 are opened and closed so that alternate layers of CdTe and HgTe respectively are grown (FIG. 2a). Due to the small thickness of each grown layer diffusion takes place during growth. The result is a layer 37 of material $Cd_xHg_{1-x}Te$ (FIG. 2b). Such diffusion is quite limited, typically to less than 1 μm. Thus the value of x can be changed during growth of many layers to give a device with a gradually changing composition (varying x) or one with sharp changes in the value of x.

The layer of C.M.T. grown on the substrate may include one or more dopants. Such a dopant is provided by passing hydrogen from the manifold through a mass flow controller 23 to a bubbler 25 containing an alkyl of the dopant. Alternatively a volatile hydride of the dopant in hydrogen may be used. From the bubbler the alkyl passes to the mixer 15 and thence to the vessel 16. Valves 26, 27, 28 control the flow of hydrogen and alkyl.

Examples of dopants and their alkyls are as follows: Al, Ga, As, and P from the respective alkyls $(CH_3)_3Al$, $(CH_3)_3Ga$, $(CH_3)_3As$, $(CH_3)_3P$, $(C_2H_5)_3Al$, $(C_2H_5)_3Ga$, $(C_2H_5)_3P$.

Examples of dopants and their hydrides are as follows: Si, Ge, As, and P from their respective hydrides $SiH_4$, $GeH_4$, $AsH_3$ and $PH_3$. A supply of the hydrides e.g. $SiH_4$ may be supplied direct from gas cylinders.

In another form of the apparatus (not shown) the Cd compound supply 6 is connected via the valve 11 direct into the vessel 16 at a distance from the Te compound entrance. A deflector is arranged inside the vessel and is movable to direct Cd either over or away from the substrate. This allows Cd, Te, and Hg to flow over the substrate, to grow CdTe; or for Te and Hg to flow over the substrate and grow HgTe. An advantage of this arrangement is that gas flow rates can remain constant whilst the two layers, CdTe, and HgTe are growing.

As an alternative to a movable deflector the substrate may be moved between two positions in the vessel. The first position is in a flow of Cd, Te and Hg whilst the second position is in a flow of Te and Hg gas.

Using the above method and apparatus infra red detectors may be made. Such a detector may be a layer of C.M.T. on a CdTe substrate with a passivating layer of oxide or CdTe on the C.M.T. layer surface. The detector may be in the form of a strip with electrodes on the surface at each end as described in U.K. Patent Specification No. 1,488,258. Such a detector is photo conductive and has the image of a thermal scene scanned over its surface.

Another type of I.R. detector uses a p-n junction e.g. the junction between two differently doped, p and n doped, C.M.T. layers to form a photo-voltaic detector. A voltage is applied by electrodes across the p-n junction and changes in current are a measure of the infrared photons that are absorbed by the detector. Such a detector may be formed into a large array of I.R. detectors capable of imaging a thermal scene, without a scanning system, to form a so-called staring array system.

We claim:

1. A method of growing a layer of the ternary alloy $Cd_xHg_{1-x}Te$ onto a substrate comprises the steps of providing an atmosphere of mercury vapour at a required temperature and pressure inside a vessel; controlling the temperature of the substrate independently of the vessel temperature; providing separate supplies of a cadmium compound, a tellurium compound, and a dilutant gas into the vessel to grow a layer of HgTe $t_1$ thick and a layer of CdTe $t_2$ thick in either order; switching the supply of cadmium compound to the substrate on and off to grow a layer of CdTe and of HgTe, the combined thickness $t_1+t_2$ of the two layers being not greater than 0.5 μm thick, the arrangement being such that the Cd compound decomposes preferentially with the Te compound in the region of the substrate to form CdTe as a layer on the substratre, the Te compound combines with the Hg vapour to form a HgTe layer on the substrate, the thickness of both layers allowing diffusion during growth to give a layer of $Cd_xHg_{1-x}Te$ where $0<x<1$.

2. The method of claim 1 wherein $0.1 \leq x \leq 0.9$.

3. The method of claim 1 wherein the combined thickness $t_1+t_2$ is less than 0.25 μm.

4. The method of claim 1 wherein the temperature of the substrate is within 400° to 430° C.

5. The method of claim 1 wherein the ratio of $t_1$ and $t_2$ and hence the value of x is varied during growth of the $Cd_xHg_{1-x}Te$ layer.

6. The method of claim 1 and further comprising the steps of stopping the flows of Cd and Te compounds over the substrate, allowing Hg and dilutant gas to flow over the substrate whilst the last grown layer diffuses with the previous layer for a period less than 10 minutes.

7. The method of claim 1 and further comprising the step of admitting a dopant compound into the vessel and over the substrate.

8. The method of claim 1 wherein a further layer is grown on the $Cd_xHg_{1-x}Te$, said further layer being of CdTe, ZnS, or $CdTe_xSe_{1-x}$.

9. The method of claim 1 wherein the Cd compound is an alkyl selected from dimethyl cadmium, diethyl cadmium, or dipropyl cadmium.

10. The method of claim 1 wherein the Te compound is on the alkyl selected from diethyl telluride, dimethyl telluride, dipropyl telluride, or dibutyl telluride, etc., or equivalent hydrogen substituted tellurium alkyls, or equivalent hydrogen substituted tellurium alkyls.

11. The method of claim 1 wherein the dopant compound is an alkyl selected from the group $(CH_3)_3Al$, $(CH_3)_3Ga$, $(CH_3)_3As$, $(CH_3)_3P$, $(C_2H_5)_3Al$, $(C_2H_5)_3Ga$, $(C_2H_5)_3P$ or a hydride selected from the group $SiH_4$, $GeH_4$, $AsH_3$, $PH_3$.

12. The method of claim 1 wherein the substrate is CdTe, Si, GaAs, $MgAl_2O_4$, or $Al_2O_3$.

13. The method of claim 1 wherein the supply of cadmium compound to the vessel is switched on and off whilst growing CdTe and HgTe layers.

* * * * *